United States Patent [19]

Beck et al.

[11] 3,900,337

[45] Aug. 19, 1975

[54] METHOD FOR STRIPPING LAYERS OF ORGANIC MATERIAL

[75] Inventors: Wolfgang Beck, Boeblingen; Friedrich C. Brunner, Sindelfingen; Peter U. Frasch, Boeblingen; Blanka Ivancic, Boeblingen; Friedrich W. Schwerdt, Boeblingen; Theodor Vogtmann, Holzgerlingen, all of Germany

[73] Assignee: International Business Machines Corporation, Armonk, N.Y.

[22] Filed: Apr. 5, 1974

[21] Appl. No.: 458,254

[52] U.S. Cl. .......................... 134/3; 96/36; 156/17; 252/79.2

[51] Int. Cl.[2] .................. H01L 21/312; C09K 13/04

[58] Field of Search .............. 252/79.2, 79.1; 156/7, 156/13, 17, 18; 96/36, 36.2; 134/37, 38, 40, 3

[56] References Cited

UNITED STATES PATENTS

| | | | |
|---|---|---|---|
| 3,373,114 | 3/1968 | Grunwald | 252/79.3 |
| 3,676,219 | 7/1972 | Schroeder et al. | 156/13 |
| 3,728,154 | 4/1973 | Suzuki | 156/17 |
| 3,752,714 | 8/1973 | Ito et al. | 156/17 |
| 3,801,512 | 4/1974 | Solenberger | 156/18 |

*Primary Examiner*—Charles E. Van Horn
*Assistant Examiner*—Jerome W. Massie
*Attorney, Agent, or Firm*—David M. Bunnell

[57] ABSTRACT

Layers of organic material, especially of polymerized photoresist, are removed by means of a mixture of an at least 95% $H_2SO_4$, and an at least 30% $H_2O_2$, at a ratio of at least 15:1 (referring to the anhydrous chemical substances). The $H_2O_2$ content of the aqueous $H_2O_2$ is to be in a ratio of at least 11:1 to the $H_2O$ content of the $H_2SO_4$. The cleaning effect is based on the dehydrating effect of the $H_2SO_4$, and the oxidizing effect of the $H_2O_2$.

8 Claims, 1 Drawing Figure

METHOD FOR STRIPPING LAYERS OF ORGANIC MATERIAL

METHOD FOR STRIPPING LAYERS OF ORGANIC MATERIAL
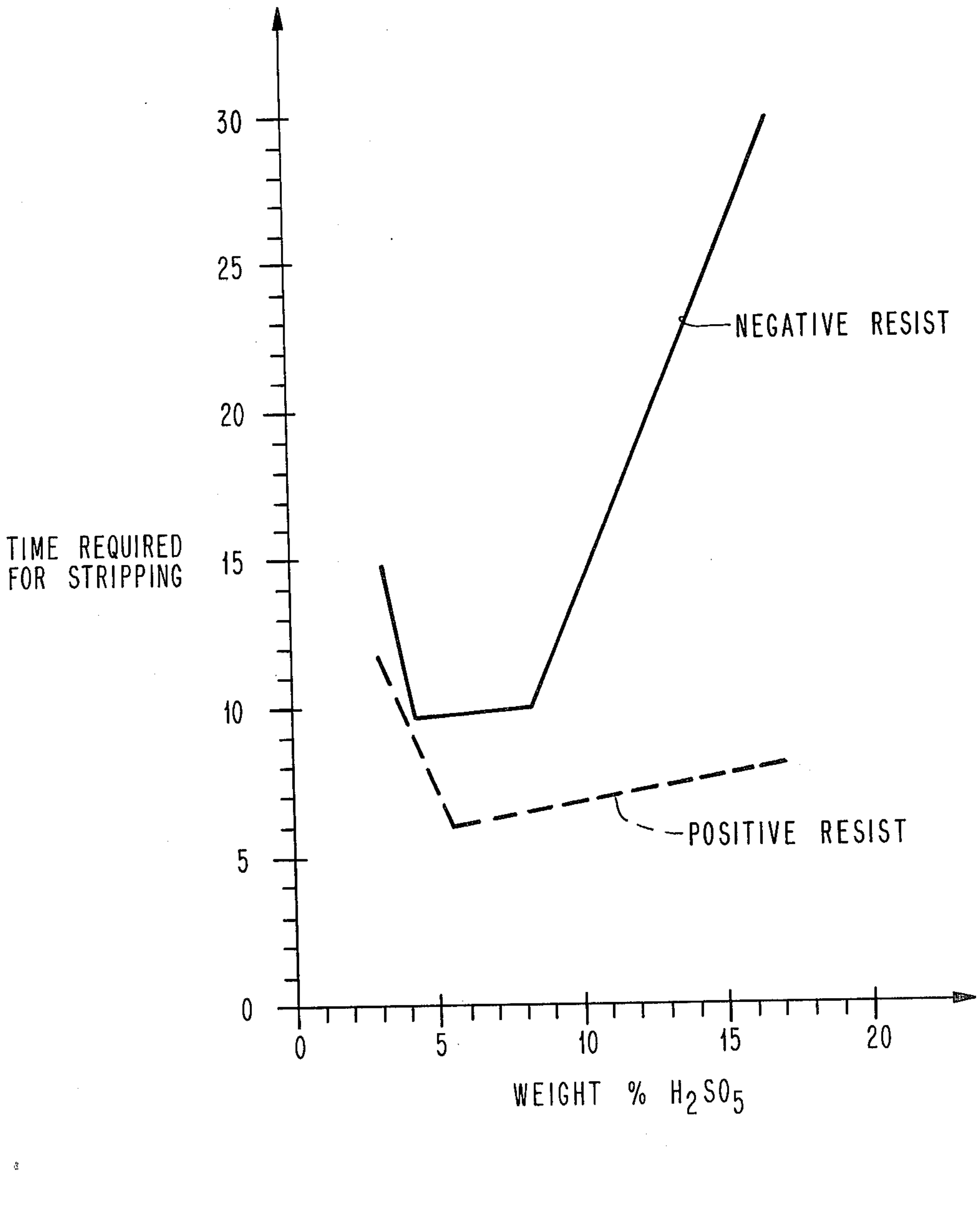

METHOD FOR STRIPPING LAYERS OF ORGANIC MATERIAL

BACKGROUND OF THE INVENTION

The invention relates generally to a method for stripping layers of organic material on the surface of substrates which are resistant to oxidizing acids and more particularly to a method for stripping layers of polymerized photoresist.

In the manufacture of very small components by means of chemical and physical methods, the cleanness of surfaces considerably influences the yield. Because dirt is frequently of organic origin, effective methods are needed for removing organic material from the surface of the components. This problem is of particular importance in the semiconductor field.

The development of semiconductor technology is characterized by growing miniaturization and ever-increasing integration. With the dimensions used today in semiconductor components for conductive lines, line spacings, and active components, individual dirt particles and spots with a diameter of $\leq 5\mu$ can cause defects which spoil entire integrated circuits. It is true that semiconductor components are normally made in clean rooms or at least in clean work stations, but such measures cannot completely prevent dirt particles from reaching semiconductor surfaces. Besides, it is a characteristic feature of semiconductor technology that organic materials, as e.g. photoresist in photolithographic process steps, have to be applied to the surface of the semiconductor wafer. For that reason, effective methods are needed for removing organic material, particularly photoresist, from semiconductor surfaces. A dry method is known in the art where organic material is burnt in an oxygen glow discharge. The method removes organic material, particularly photoresist, quite reliably but it requires much time and a complex apparatus and it involves the risk of ion generation in oxide layers due to electron bombardment. Such ion generation can present problems particularly in FET components. Liquids are known for stripping positive and negative photoresists which include phenol and a sodium salt. Although the cleaning effect of the liquid is satisfactory, it is immiscible with water which complicates its use. Phenols also provide disposal problems. Sulphuric acid heated to 150°C has also been used for stripping photoresist, but this method is dangerous for use in a manufacturing process, and besides the acid soon becomes useless owing to discolouring or contamination through material with high carbon contents.

It is also known from the publication "Kodak Seminar on Microminiaturization 4/3 and 4/65", Kodak Pub. P-77 (4/66), p. 37, Eastman Kodak Co., to use a mixture consisting of equal parts of $H_2SO_4$ and $H_2O_2$ in order to strip polymerized photoresist from semiconductor substrates. However, in this publication this mixture and its vapours are described as highly corrosive and dangerous, and the lifetime of the mixture is given as 15 minutes, which means that it would not be suitable for manufacturing purposes. This mixture does not appear to be fully satisfactory at room temperature in view of the relatively low $H_2SO_4$ content and in the final lecture of that seminar it is pointed out that the mixture is used when hot.

DESCRIPTION OF THE DRAWING

The drawing is a graph showing the dependence of the time required for stripping positive or negative photoresist as a function of the weight percent contents of the mixture of Caro acid.

BRIEF SUMMARY OF THE INVENTION

It is the object of the invention to provide a method for the reliable, fast and inexpensive stripping of layers of organic material from substrates. The method is realizable without a complex apparatus, prevents the metal-contamination of the parts to be cleaned, and employs chemical substances that can be disposed of without pollution problems.

According to the process of the invention, this object is achieved by providing a mixture of $H_2SO_4$ and $H_2O_2$ in a ratio of at least 15:1, refering to volume quantities of the anhydrous chemical substances using at least 95% by weight sulphuric acid ($H_2SO_4$) and an at least 30% by weight aqueous hydrogen peroxide ($H_2O_2$). The substrates carrying the organic material are first immersed in the mixture, rinsed under running water, and finally dried.

The stripping mixture for use in the process of the invention has a lifetime of more than three weeks and does not contain any metal ions. The mixture is miscible with water in any ratio, so that it can be rinsed quickly and cheaply and disposed of without any problems. The mixture can be used at room temperature, is inexpensive, and has excellent cleaning characteristics.

DETAILED DESCRIPTION

It has been found that the cleaning efficiency of the stripping mixture is strongly influenced by the water content of the original components. A low water content in the $H_2SO_4$ is needed and the amount of water in the $H_2SO_4$ has a relatively greater effect on the action of the mixture than a high water content in the $H_2O_2$. It is advisable, therefore, to use amounts of the two components such that the percent by weight $H_2O_2$ content of the aqueous $H_2O_2$ solution is of a ratio of at least 11:1 to the percent by weight water content of the $H_2SO_4$.

For making the mixture it is preferred that the $H_2SO_4$ and $H_2O_2$ are mixed in a ratio between about 17:1 and 35:1 acid to peroxide relative to each other (referring to volume quantities of the anhydrous chemical substances). A mixture containing more $H_2O_2$ would be unnecessarily expensive and the dehydrating effect of the mixture would be suppressed too strongly. In a mixture containing less $H_2O_2$ the oxidizing effect is too low. Within the given range it may be advisable, according to the characteristics of the meterial to be removed, to put the stress either on the dehydrating or on the oxidizing effect of the mixture. A ratio of at least about 15:1 acid to peroxide is required.

To accelerate the cleaning process, it is advisable to immerse the substrate with the organic material first for a predetermined period in a mixture with an $H_2SO_4$ content approaching the upper limit of the above cited mixture ratio, and subsequently for a predetermined period in a mixture with an $H_2SO_4$ content approaching the lower limit. In this version of the process the material to be removed is subjected in the first bath to a strongly dehydrating effect, and in the second bath to a strongly oxidizing effect. No compromise between the oxidizing and dehydrating effect of a single mixture has to be made and it is possible to reduce the overall cleaning time. It should also be pointed out that it is not advisable to do without added $H_2O_2$ in the first bath because the oxidizing effect of the bath is required for keeping it clean and for permeating thick layers of organic material.

The mixture can be employed quite generally for stripping organic materials from substrates which are not affected by the mixture themselves. It can be used particularly advantageously for destroying organic material on semiconductor wafers, particularly those with field effect transistors because it does not contain any metal ions and can be rinsed off completely with $H_2O$.

Because it is possible to strip organic residues which exist in relatively large quantities and layer thicknesses, the process is particularly suitable for removing exposed photoresist.

In making the mixture, concentrated sulphuric acid is added to an aqueous solution of hydrogen peroxide ($H_2O_2$). The following endothermic reaction takes place:

$$H_2SO_4 + H_2O_2 \rightarrow H_2SO_5 + H_2O$$

The mixture temperature upon the mixing of $H_2SO_4$ and $H_2O_2$ supplies the necessary reaction heat. If for instance 955 milliliters of 95 to 97% $H_2SO_4$ are slowly added to 45 milliliters of 85% $H_2O_2$ the temperature of the mixture rises to 70°C.

The effective components of the mixture are the dehydrating $H_2SO_4$ and the oxidizing Caro acid ($H_2SO_5$). The organic material is transferred by dehydration into a material of higher carbon content which subsequently, upon oxidation, is oxidized substantially to form $CO_2$ and $H_2O$.

Surprisingly it has been found out that too much water especially in the added $H_2SO_4$ prevents the forming of the Caro acid and thus strongly reduces the oxidizing effect of the mixture. The damaging effect of the water in the $H_2SO_4$ can only be compensated by a drastic reduction of the water contents in the $H_2O_2$. Thus, to give an example, mixtures of 95% $H_2SO_4$ and 85% $H_2O_2$, or 97.5% $H_2SO_4$ and 30% $H_2O_2$, have a removing effect on the organic material, but a mixture of 95% $H_2SO_4$ and 50% $H_2O_2$ has only a low oxidizing effect.

The content of Caro acid in the mixture is calculated from the content of active oxygen in the mixture, which can be determined, e.g. oxidimetrically, by using an arsenite solution and by back titration with Cer-IV-sulphate with osmium tetroxide as catalyst and ferroin as indicator. Qualitatively, the effect of the mixture can be tested by immersing a wad of cotton. If the cotton shows a change in color the destroying effect of the mixture is satisfactory.

The drawing shows that there is a composition range of the mixture where the cleaning effect is particularly high. This range lies between 3 and 10 percent by weight of Caro acid and is established by mixing volume quantities, refering to anhydrous chemical substances, of $H_2SO_4$ and $H_2O_2$ with a ratio of 35:1 and 17:1. The maximum of the curve is plausible as the dehydrating and the oxidizing effect are proportional to the $H_2SO_4$ and the $H_2O_2$ contents in the mixture. Expecially in compounds with many OH-groups, which include e.g. positive photoresists, it is advisable to support the dehydrating effect of the mixture, i.e., to increase the $H_2SO_4$ percentage in the mixture to the disadvantage of the $H_2O_2$ percentage.

The mixture, which is preferably prepared in a polyfluorocarbon beaker, is ready for use after having been cooled to room temperature. The substrates with the organic material are immersed in the mixture for a predetermined period sufficient to remove the organic material. Subsequently, they are rinsed in a rinsing cascade of de-ionized water until the incoming and the outgoing water shows the same conductivity, and finally they are dried.

The mixture has a lifetime of at least three weeks, but only under the condition that chemical substances of a grade of at least DAB6 (Deutsches Arzneibuch Nr.6) are used (reagent grade). It has been found that decomposition starts immediately after mixing if chemical substances of the technical grades have been employed. The cleaning effect can be increased still further, or accelerated, respectively, if two baths are used, one being more dehydrating, i.e. richer in $H_2SO_4$, and the second more oxidizing, i.e. richer in Caro acid. It should be observed in that connection that a first bath which is only of a dehydrating effect, i.e., which consists of pure $H_2SO_4$, is not desirable because dehydrated but not completely oxidized particles quickly contaminate the first bath and would thus make it useless, i.e., the lifetime of the bath will be increased by added $H_2O_2$, besides, the dehydrating and the oxidizing effect has to be of a cooperating nature for thicker organic layers in order to completely penetrate the organic material with the mixture. For that reason, it is not advisable to let the content of Caro acid of the second bath reach too high a peak, apart from the fact that the mixture would then be more unstable and unnecessarily expensive.

The following six examples illustrate the process with more detail but are not intended to be limiting.

In all examples, 20 semiconductor wafers with an approximate diameter of 57 mm have been coated with photoresist; then they were exposed through a mask, and the exposed image was developed. Finally, the remaining zones of polymerized photoresist in the mixture were removed.

The materials, mixtures, and test conditions employed with characterize the individual examples are listed in Table I below.

The polymerized photoresist was removed completely and without residues from all semiconductor wafers.

Besides, it was found through continuous tests that per liter of the mixture used in Example 6, polymerized photoresist covering one side of more than 2000 semiconductor wafers with an approximate diameter of 57 mm can be removed completely.

TABLE I

| Example No. | Bath No. 1 $H_2O_2$:$H_2SO_4$ By Volume | Bath No. 1 Immersion Time (Min.) | Bath No. 2 $H_2O_2$:$H_2SO_4$ By Volume | Bath No. 2 Immersion Time (Min.) | $H_2O_2$ Concentr. By Weight | $H_2SO_4$ Concentr. By Weight | Organic Material (Layer thickness) |
|---|---|---|---|---|---|---|---|
| 1 | 1:10 | 7 | — | — | 30% | ≥ 97.5% | negative photoresist (0.8 μ) |
| 2 | 1:10 | 10 | — | — | 30% | ≥ 97.5% | positive photoresist (1.5 μ) |

TABLE I

| Example No. | Bath No. 1 $H_2O_2:H_2SO_4$ By Volume | Bath No. 1 Immersion Time (Min.) | Bath No. 2 $H_2O_2:H_2SO_4$ By Volume | Bath No. 2 Immersion Time (Min.) | $H_2O_2$ Concentr. By Weight | $H_2SO_4$ Concentr. By Weight | Organic Material (Layer thickness) |
|---|---|---|---|---|---|---|---|
| 3 | 1:10 | 3 | 1:6 | 2 | 30% | ≥ 97.5% | negative photoresist (0.8 μ) |
| 4 | 1:10 | 3 | 1:6 | 3 | 30% | ≥ 97.5% | positive photoresist (1.5 μ) |
| 5 | 1:21 | 3 | 1:21 | 3 | 85% | ≥ 95 % | negative photoresist (0.8 μ) |
| 6 | 1:21 | 5 | 1:21 | 5 | 85% | ≥ 95 % | positive photoresist (0.8 μ) |

While this invention has been particularly described with reference to the preferred embodiments thereof, it will be understood by those skilled in the art that the foregoing and other changes in form and details may be made therein without departing from the spirit and scope of the invention.

What is claimed is:

1. Method for stripping layers of organic material from the surface a substrate which is resistant to oxidizing acids comprising:
   providing a mixture of $H_2SO_4$ and $H_2O_2$ in a ratio of at least about 15:1, acid to peroxide, referring to volume quantities of the anhydrous chemical substances, using at least 95% by weight sulphuric acid and an at least 30% $H_2O_2$ by weight aqueous $H_2O_2$ solution; and immersing said substrate in said mixture.

2. The method of claim 1 including the steps of rinsing said substrate in water and drying said substrate after the resist has been stripped by immersion in said mixture.

3. The method of claim 1 in which the percent by weight $H_2O_2$ content of the aqueous $H_2O_2$ solution is in a weight percent ratio of at least 11:1 relative to the percent by weight water content of the $H_2SO_4$.

4. The method of claim 1 in which the volume quantities of $H_2SO_4$ and $H_2O_2$ are in a ratio between about 17:1 and 35:1.

5. The method of claim 3 in which the volume quantities of $H_2SO_4$ and $H_2O_2$ are in a ratio between about 17:1 and 35:1.

6. The method of claim 5 in which said substrate with the organic material is first immersed for a predetermined period of time in a mixture with an $H_2SO_4$ content approaching the upper limit of the mixture ratio, and subsequently for a predetermined period in a mixture with an $H_2SO_4$ content approaching the lower limit.

7. The method of claim 1 in which said organic material is removed from a semiconductor wafer.

8. The method of claim 1 in which said organic material is a patterned photoresist.

* * * * *